(12) United States Patent
Yao et al.

(10) Patent No.: US 8,921,175 B2
(45) Date of Patent: *Dec. 30, 2014

(54) PROCESS OF FORMING AN ELECTRONIC DEVICE INCLUDING A NONVOLATILE MEMORY CELL

(75) Inventors: Thierry Coffi Herve Yao, Portland, OR (US); Gregory James Scott, Inkom, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 242 days.

This patent is subject to a terminal disclaimer.

(21) Appl. No.: 13/554,915

(22) Filed: Jul. 20, 2012

(65) Prior Publication Data

US 2014/0022844 A1    Jan. 23, 2014

(51) Int. Cl.
H01L 21/8238    (2006.01)

(52) U.S. Cl.
USPC ....... 438/201; 438/257; 257/315; 257/E21.68

(58) Field of Classification Search
USPC .......... 365/185.08, 185.24, 185.28; 257/314, 257/315, E21.68; 438/201, 257, 264
See application file for complete search history.

(56) References Cited

U.S. PATENT DOCUMENTS

| | | | |
|---|---|---|---|
| 4,317,272 A | | 3/1982 | Kuo et al. |
| 5,427,966 A | | 6/1995 | Komori et al. |
| 5,911,105 A | | 6/1999 | Sasaki |
| 6,459,615 B1 | * | 10/2002 | McPartland et al. ....... 365/185.1 |
| 6,788,574 B1 | | 9/2004 | Han et al. |
| 7,263,001 B2 | | 8/2007 | Wang et al. |
| 7,889,553 B2 | * | 2/2011 | Terzioglu et al. .......... 365/185.1 |
| 8,284,600 B1 | * | 10/2012 | Poplevine et al. ....... 365/185.05 |
| 8,409,944 B2 | * | 4/2013 | Yao et al. ...................... 438/201 |
| 8,669,604 B2 | * | 3/2014 | Yao et al. ...................... 257/298 |
| 2006/0128097 A1 | | 6/2006 | Ding |
| 2006/0220096 A1 | | 10/2006 | Wang et al. |
| 2007/0121381 A1 | | 5/2007 | Kalnitsky et al. |
| 2008/0248623 A1 | | 10/2008 | Tsai et al. |
| 2011/0316060 A1 | | 12/2011 | Yao et al. |
| 2011/0316067 A1 | | 12/2011 | Yao et al. |
| 2011/0317492 A1 | | 12/2011 | Yao et al. |

OTHER PUBLICATIONS

U.S. Appl. No. 12/822,992, filed Jun. 24, 2010, Inventors: Thierry Coffi Herve Yao et al.
U.S. Appl. No. 12/823,011, filed Jun. 24, 2010, Inventors: Thierry Coffi Herve Yao et al.
Office Action mailed Jul. 27, 2012 in Related U.S. Appl. No. 12/822,992.
U.S. Appl. No. 13/554,867, filed Jul. 20, 2012, Inventors: Thierry Coffi Herve Yao et al.
U.S. Appl. No. 12/822,948, filed Jun. 24, 2010, Inventors: Thierry Coffi Herve Yao et al.

* cited by examiner

*Primary Examiner* — Thao H Bui
(74) *Attorney, Agent, or Firm* — Abel Law Group, LLP

(57) ABSTRACT

An electronic device can include a tunnel structure that includes a first electrode, a second electrode, and tunnel dielectric layer disposed between the electrodes. In a particular embodiment, the tunnel structure may or may not include an intermediate doped region that is at the primary surface, abuts a lightly doped region, and has a second conductivity type opposite from and a dopant concentration greater than the lightly doped region. In another embodiment, the electrodes have opposite conductivity types. In a further embodiment, an electrode can be formed from a portion of a substrate or well region, and the other electrode can be formed over such portion of the substrate or well region.

20 Claims, 8 Drawing Sheets

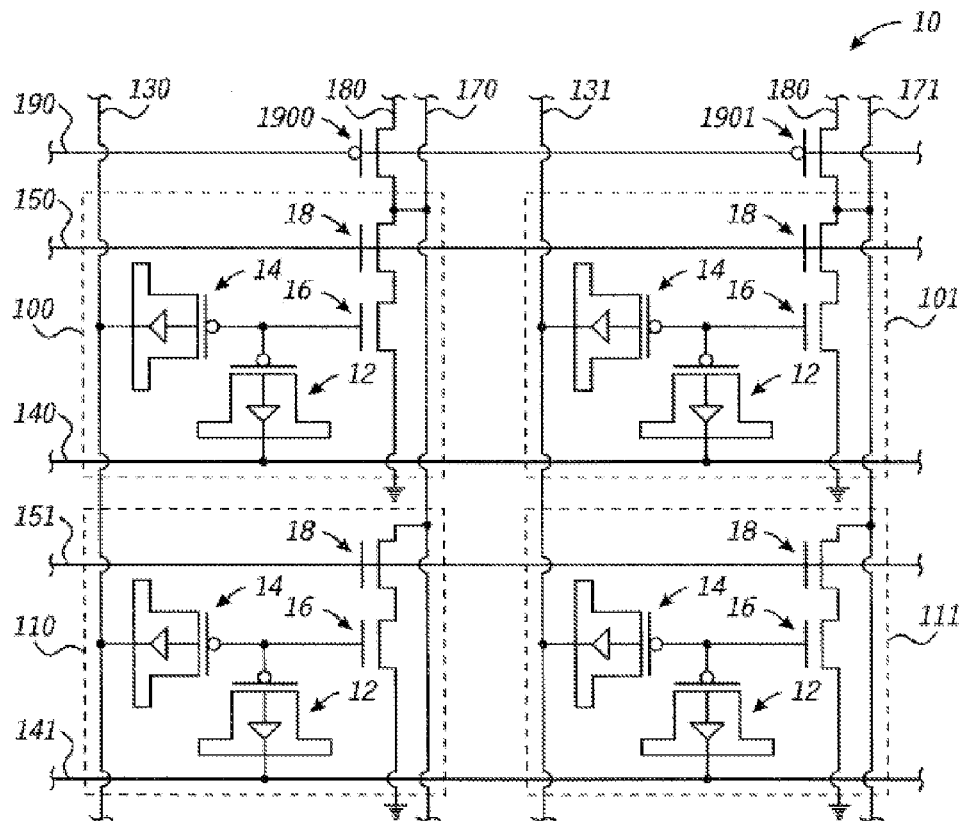

FIG. 1 (PRIOR ART)

|  | ROW | COLUMN | BL | AL | CL | EL | RD_en |
|---|---|---|---|---|---|---|---|
| READ | SELECTED | SELECTED | 0V/VDD | VDD | VDD/2 | VDD | 0V |
|  | SELECTED | UNSELECTED | 0V/VDD | VDD | VDD/2 | VDD | 0V |
|  | UNSELECTED | SELECTED | 0V/VDD | 0V | 0V | VDD | 0V |
|  | UNSELECTED | UNSELECTED | 0V/VDD | 0V | 0V | VDD | 0V |
| ERASE | SELECTED | SELECTED | NA | 0V | 0V | 10V | VDD |
|  | SELECTED | UNSELECTED | NA | 0V | 0V | VDD | VDD |
|  | UNSELECTED | SELECTED | NA | 0V | VDD | 10V | VDD |
|  | UNSELECTED | UNSELECTED | NA | 0V | VDD | VDD | VDD |
| PROGRAM | SELECTED | SELECTED | NA | 0V | 10V | 0V | VDD |
|  | SELECTED | UNSELECTED | NA | 0V | 10V | VDD | VDD |
|  | UNSELECTED | SELECTED | NA | 0V | 0V | 0V | VDD |
|  | UNSELECTED | UNSELECTED | NA | 0V | 0V | VDD | VDD |

FIG. 2 (PRIOR ART)

|  | ROW | COLUMN | BL | AL | CL | EL | SL |
|---|---|---|---|---|---|---|---|
| READ | SELECTED | SELECTED | VDread | VAccess | VGread | VGread | 0V |
|  | SELECTED | UNSELECTED | 0V | VAccess | VGread | VGread | 0V |
|  | UNSELECTED | SELECTED | VDread | 0V | 0V | 0V | 0V |
|  | UNSELECTED | UNSELECTED | 0V | 0V | 0V | 0V | 0V |
| ERASE | SELECTED | NA | 0V | 0V | 0V | VPP | 0V |
|  | UNSELECTED | NA | 0V | 0V | 0V | 0V | 0V |
| PROGRAM | SELECTED | SELECTED | 0V | 0V | VPP | VPP | 0V |
|  | SELECTED | UNSELECTED | 0V | 0V | VPP | VPP | Vinhibit |
|  | UNSELECTED | SELECTED | 0V | 0V | 0V | 0V | 0V |
|  | UNSELECTED | UNSELECTED | 0V | 0V | 0V | 0V | Vinhibit |

*FIG. 5*

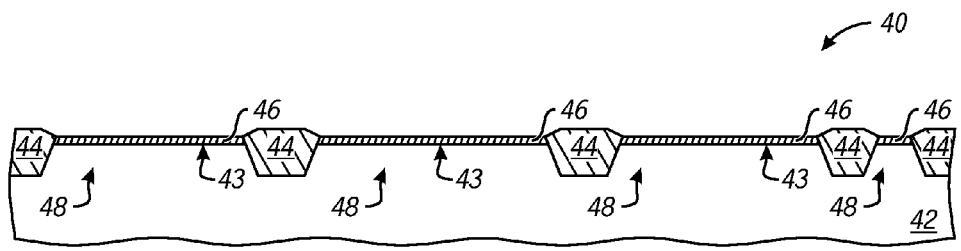

*FIG. 6*

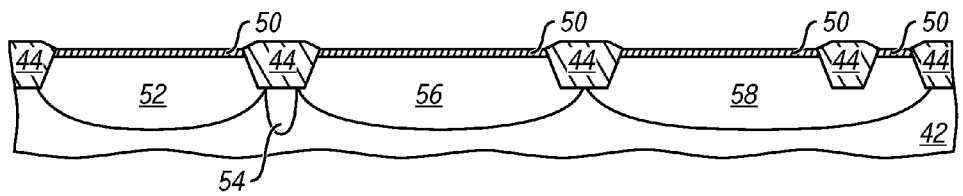

*FIG. 7*

PROCESS OF FORMING AN ELECTRONIC DEVICE INCLUDING A NONVOLATILE MEMORY CELL

FIELD OF THE DISCLOSURE

The present disclosure relates to electronic devices and processes of forming electronic devices, and more particularly to, electronic devices including nonvolatile memory cells including tunnel structures and processes of forming the same.

RELATED ART

Integrated circuits can include a logic block that includes a data processing unit, such as a central processing unit, a graphical processing unit or the like, and a memory block that stores data that can be used by the data processing unit or stored within a hard drive, storage network, or other large memory device. The memory block can include volatile memory, nonvolatile memory, or a combination thereof. Many nonvolatile memories include additional layers as compared to transistors within the logic block. A conventional nonvolatile memory can include a charge storage layer disposed over a substrate, and a control gate overlying the charge storage layer. The charge storage layer can include a floating gate layer, a nitride layer, a layer of nanocrystals or nanoclusters, or the like. The additional layers increase costs, increase production times, and reduce yield.

Some integrated circuits have memory cells with only one gate electrode layer. Such integrated circuits can use a single gate layer to form the gate electrodes for nonvolatile memory cells and transistors within the logic block. A combination of separate charge storage and control gate layers is not needed. The process to make such integrated circuits is referred to as a single poly process, as the nonvolatile memory cells can be made with only a single layer of polycrystalline silicon.

FIG. 1 includes a schematic diagram of a portion of a conventional nonvolatile memory array 10 that can be made with a single poly process. The nonvolatile memory array 10 includes four memory cells 100, 101, 110, and 111 that are arranged in rows and columns. Each memory cell includes capacitors 12 and 14, a state transistor 16, and an access transistor 18. Electrodes of the capacitors 12 and 14 and the gate of the state transistor 16 are connected to one another at an electrically floating node. The capacitors 12 and 14 are in the form of p-channel metal-insulator-semiconductor field-effect transistor structures. Such structures are hereinafter referred to as "PMOS capacitors." The state and access transistors 16 and 18 are n-channel transistors and are connected in series within each nonvolatile memory cell.

Other electrodes of the capacitors 12 are electrically connected to control lines 140 and 141, and other electrodes of the capacitors 14 are electrically connected to erase lines 130 and 131. Sources of the state transistors 16 are electrically connected to a common ground, and the drains of the access transistors 18 are electrically connected to bit lines 170 and 171. The gates of the access transistors 18 are electrically connected to access lines 150 and 151. The memory array further includes p-channel transistors 1900 and 1901. Drains of the p-channel transistors 1900 and 1901 are electrically connected to the drains of the access transistors 18 within the memory cells 100 and 101, respectively, sources of the p-channel transistors 1900 and 1901 are electrically connected to a $V_{DD}$ line 180, and gates of the p-channel transistors 1900 and 1901 are electrically connected to a read-enable line.

FIG. 2 includes a table with voltages used to read, erase, and program the memory cells 100, 101, 110, and 111. In FIG. 2, BL refers to bit lines, AL refers to access lines, CL refers to control lines, EL refers to erase lines, and RD_en refers to the read enable line. As will be discussed in more detail later in this specification, the architecture of the nonvolatile memory cell and its use can result in erase disturb and reliability issues.

BRIEF DESCRIPTION OF THE DRAWINGS

Embodiments are illustrated by way of example and are not limited in the accompanying figures.

FIG. 1 includes a schematic diagram of a portion of a conventional nonvolatile memory array. (Prior Art)

FIG. 2 includes an operating table with voltages used to read, erase, and program the memory cells in the nonvolatile memory array of FIG. 1. (Prior Art)

FIG. 5 includes an operating table with voltages used to read, erase, and program the memory cells in the nonvolatile memory array of FIG. 4.

FIG. 6 includes an illustration of a cross-sectional view of a portion of a workpiece including a substrate after forming an insulating layer and field isolation regions.

FIG. 7 includes an illustration of a cross-sectional view of the workpiece of FIG. 6 after forming well regions.

Figure 3:
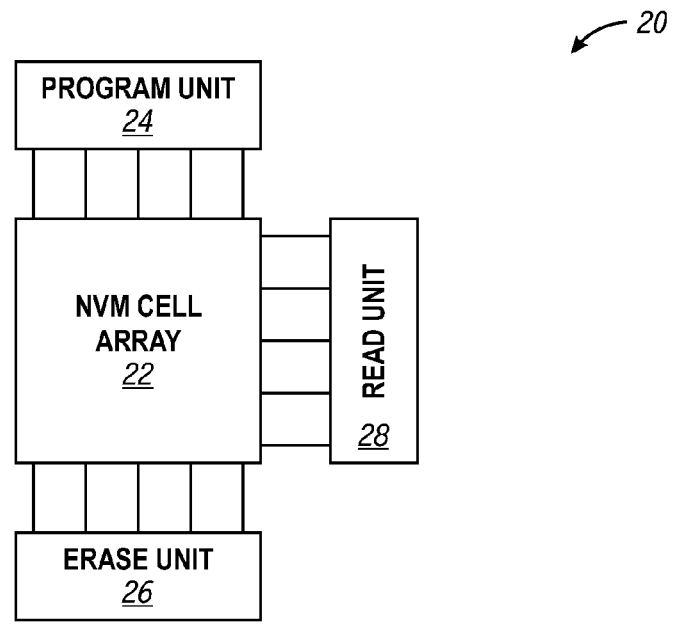
FIG. 3 includes a depiction of an integrated circuit that includes a nonvolatile memory cell array, a program unit, an erase unit, and a read unit in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention.

The term "coupled" is intended to mean a connection, linking, or association of two or more electronic components, circuits, systems, or any combination of: (1) at least one electronic component, (2) at least one circuit, or (3) at least one system in such a way that a signal (e.g., current, voltage, or optical signal) may be partially or completely transferred from one to another. A non-limiting example of "coupled" can include a direct electrical connection between electronic component(s), circuit(s) or electronic component(s) or circuit (s) with switch(es) (e.g., transistor(s)) connected between them. Thus, an electrical connection is a specific type of coupling; however, not all couplings are electrical connections.

The term "heavily doped" is intended to mean a dopant concentration that is at least $1 \times 10^{19}$ atoms/cm$^3$.

The term "intermediate doped" is intended to mean a dopant concentration that is (1) between $1 \times 10^{17}$ atoms/cm$^3$ and $1 \times 10^{19}$ atoms/cm$^3$ or (2) higher than an adjacent lightly doped region and lower than an adjacent heavily doped region. Thus, an intermediate doped region can have a dopant concentration of $1 \times 10^{16}$ atoms/cm$^3$ when near a lightly doped region having a dopant concentration of $1 \times 10^{15}$ atoms/cm$^3$ and near a heavily doped region.

The term "lightly doped," except when referring to a lightly-doped drain ("LDD") region, is intended to mean a dopant concentration that is no greater than approximately $1 \times 10^{17}$ atoms/cm$^3$.

The term "LDD region" is intended to mean a doped region near a source region, a drain region, or a source/drain region of a transistor, wherein such doped region can help to reduce hot carrier degradation of the transistor. In many embodiments, an LDD region can have a dopant concentration that is in a range of approximately $1 \times 10^{16}$ atoms/cm$^3$ to approximately $1 \times 10^{18}$ atoms/cm$^3$. LDD regions may also be called extension regions.

The term "metal" or any of its variants when referring to a material is intended to mean to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the CRC Handbook of Chemistry and Physics, 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A novel memory architecture for a nonvolatile memory array, physical design, and methods of using the memory array can be used to improve resistance to erase disturb and improve reliability of the nonvolatile memory array. In particular, the orientation of the erase lines and programming and erasing methods can allow charge carriers to tunnel within different components within a memory cell. Charge carriers may be transferred through dielectric layers of different component, as opposed to a single dielectric layer within a single component. Thus, reliability is improved as the memory cells can withstand more program-erase cycles at a particular failure level as compare to the memory array as described with respect to FIG. 1. Further, lower programming and erase voltages may be used and still allow an acceptable threshold voltage ("V$_T$") window between programmed and erased memory cells to be achieved. More details regarding the memory architecture, physical design, and methods of using the memory array are described in more detail in reference to the figures that follow.

FIG. 3 includes a logic depiction of an integrated circuit 20 that includes a nonvolatile memory ("NVM") cell array 22 that is coupled to a program unit 24, an erase unit 26, and a read unit 28. Each of the program, erase, and read units 24, 26, and 28 can be used to provide appropriate voltages to the NVM cell array 22 for programming, erasing, and reading of memory cells within the NVM cell array 22. The units 24, 26, and 28 can include transistors, capacitors, resistors, diodes, and the like that can be connected to form a logic gate, a voltage divider, a charge pump, a switch, a latch, a column or array strobe, a sense amplifier, another circuit commonly used with nonvolatile memory arrays, or any combination thereof. Although the units 24, 26, and 28 are depicted as separate units, operations can be combined. For example, a single charge pump may be used for programming and erasing, or the same voltage divider may be used for programming and reading. Thus, FIG. 3 is presented to provide a basic understanding of different parts of the integrated circuit 20 at a conceptual level and not to constrain the architecture, physical design, or operation of the NVM array.

Figure 4:
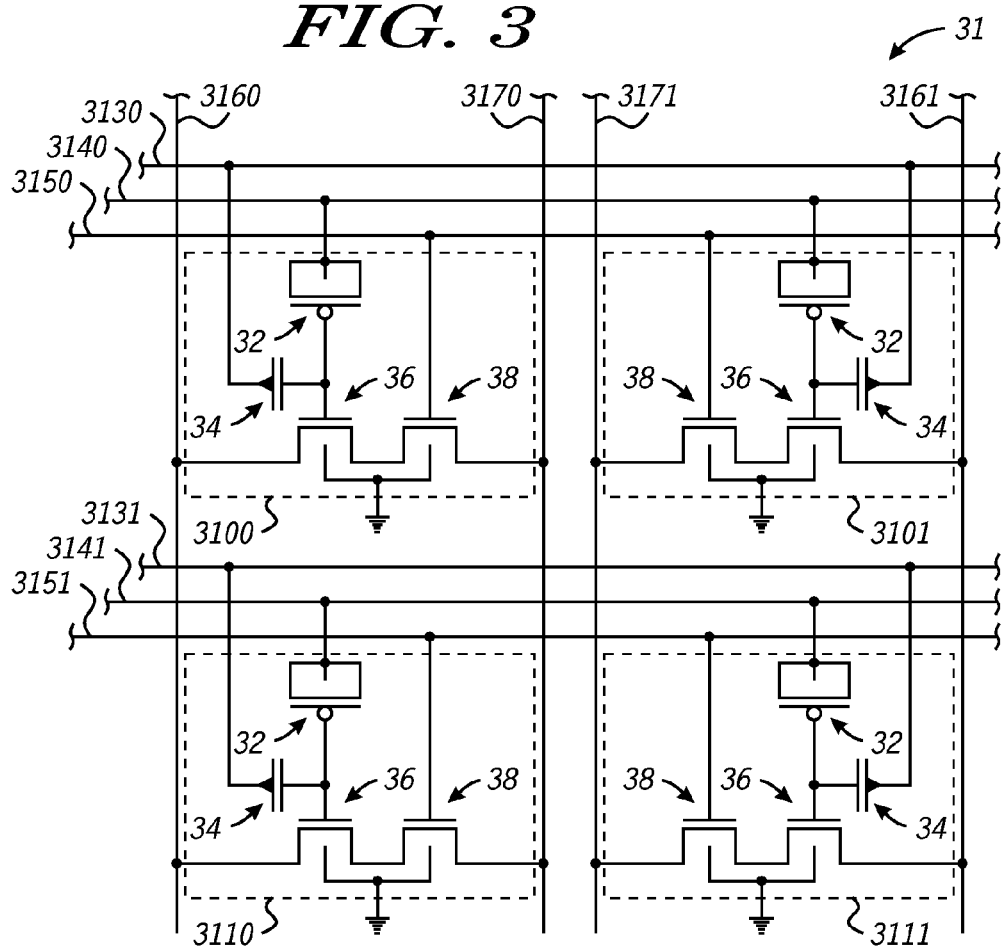
FIG. 4 includes a schematic diagram of a portion of a nonvolatile memory array in accordance with an embodiment.

FIG. 4 includes a schematic diagram of a portion of an NVM array 31. In a particular embodiment, the NVM array may be used in the integrated circuit 20 of FIG. 3. The NVM array 31 includes four memory cells 3100, 3101, 3110, and 3111 that are arranged in rows and columns. In a particular embodiment, the memory cells 3100, 3101, 3110, and 3111 are within the same sector and along immediately adjacent rows and columns. In the embodiment as illustrated in FIG. 3, each row of the NVM array 31 is driven by three terminals coupled to three lines: an access line, a control line, and an erase line. Each column of the NVM array is driven by two terminals coupled to two lines: a bit line and an access line. One terminal drives the whole array: the bulk.

Each memory cell includes a capacitor 32, a tunnel structure 34, a state transistor 36, and an access transistor 38. Each of the capacitor 32 and tunnel structure 34 includes electrodes with a dielectric disposed between the electrodes. In an embodiment, the capacitor 32, the tunnel structure 34, or both can be formed from transistor structures. In this embodiment, each of capacitor 32 and tunnel structure 34 have an electrode referred to as a gate, and another electrode referred to as the active. In a particular embodiment, the capacitor 32 is a PMOS capacitor. The tunnel structure 34 can include many different physical designs that are described in more detail later in this specification. In another embodiment (not illustrated), the capacitor 32, the tunnel structure 34, or both may be implemented as thin-film capacitors.

Each of the state and access transistors 36 and 38 includes a source region, a drain region, a body region, a gate dielectric layer, and a gate electrode. In an embodiment, the state and access transistors 36 and 38 are n-channel transistors. The gates of the capacitor 32, the tunnel structure 34, and the state transistor 36 are connected to one another at an electrically floating node called the floating gate electrode. The drain region of the state transistor 36 and the source region of the access transistor 38 are coupled to each other, and in a particular embodiment, the state and access transistors are electrically connected in series. For each of the memory cells 3100, 3101, 3110, and 3111, the drain of the access transistor 38 is the drain of the memory cell. The source of the state transistor 36 is the source of the memory cell. The gate of the access transistor 38 is the access gate of the access-gate memory cell. The active electrode of the capacitor 32 acts as the control gate of the memory cell. The active electrode of the erase structure 34 acts as the erase gate of the memory cell.

Each bit line is coupled to the drains of memory cells along at least part of the corresponding column. Each source line is coupled to the sources of memory cells along at least part of the corresponding column. Each access line is coupled to the access gate of memory cells along at least part of the corresponding row. Each control line is coupled to the control gate of memory cells along at least part of the corresponding row. Each erase line is coupled to the erase gate of all memory cells along at least part of the corresponding row. Referring to the NVM array 31, cells 3100 and 3101 have their access, control, and erase gates coupled to the access line 3150, control line 3140 and erase line 3130, respectively. Cells 3110 and 3111 have their access, control, and erase gates coupled to the access line 3151, control line 3141 and erase line 3131, respectively. Cells 3100 and 3110 have their drains and sources connected to bit line 3170 and source line 3160, respectively. Cells 3101 and 3111 have their drains and sources connected to bit line 3171 and source line 3161, respectively. The bulk (e.g., the substrate or a well region within the substrate for the state and access transistors) of all cells are grounded. In the embodiment as illustrated in FIG. 4, each of the couplings as mentioned in this paragraph can be in the form of electrical connections. For example, the source regions of the state transistors 36 are electrically connected to source lines 3170 and 3171, and the bodies of the state and access transistors 36 and 38 are electrically connected to ground or $V_{SS}$.

FIG. 5 includes a table with voltages used to read, erase, and program the NVM array 31, including memory cells 3100, 3101, 3110, and 3111. In FIG. 5, BL refers to bit lines, AL refers to access lines, CL refers to control lines, EL refers to erase lines, and SL refers to the source lines. In FIG. 5, during a read operation, $V_{Dread}$ is the voltage applied to the drain of the memory cell that is being read. $V_{Access}$ can be approximately at $V_{DD}$ for the integrated circuit. In a particular embodiment, $V_{DD}$ can be in a range of approximately 0.9 to 5 volts. $V_{Gread}$ can be selected so that current can flow out of an unprogrammed or erased memory cell. In a particular embodiment, $V_{Gread}$ can be in a range of approximately 0 volt to approximately $V_{DD}$. With respect to erase and program pulses, Vpp can be in a range of approximately 8 to approximately 25 volts. $V_{inhibit}$ can be in a range of approximately 1.8 volts to approximately $\frac{1}{2} V_{PP}$.

After reading the specification, skilled artisans will appreciate that the particular voltages used can vary depending on the technology and physical parameters (for example, thickness of a tunnel dielectric layer) of the memory cells. Further, although absolute values of voltages have been given, the voltage differences between the terminals are more significant than the absolute values of the voltages on the terminations. For example, during an erase pulse, the voltage difference between the selected erase line and the other lines is approximately $V_{PP}$. In another embodiment, the selected erase line may be at $+\frac{3}{4} V_{PP}$ and the other lines can be at approximately $-\frac{1}{4} V_{PP}$. Such an embodiment may be useful if a breakdown voltage (for example, if an enable transistor within the erase unit has a drain-to-source punchthrough voltage less than $V_{PP}$) or another concern is present. The read or program operation may be performed in addition to or instead of the erase operation.

The memory architecture and operation of the NVM array 31 allows for better reliability and less problems with disturbing data in unselected memory cells during an erase operation. When comparing the schematic diagrams of FIGS. 1 and 4, the orientation of the erase lines are different. In FIG. 4, the erase lines 3130 and 3131 are oriented in the same direction as the control lines 3140 and 3141. In a particular embodiment, the erase and control lines 3130, 3131, 3140, and 3141 are oriented along rows of memory cells. Compare this to the memory array 10 in FIG. 1 that has an orthogonal relationship between the erase lines and control lines. More particularly, in which the erase lines 130 and 131 are oriented along columns of memory cells, and the control lines 140 and 141 are oriented along columns of memory cells.

Referring to the NVM array 31, during a program pulse for a selected memory cell, electrons tunnel from the channel of the state transistor 36 to the floating gate electrode through the gate dielectric layer of the state transistor 36. During an erase pulse, electrons tunnel from the floating gate electrode to the active electrode of the tunnel structure 34, via a tunnel dielectric layer of the tunnel structure 34. Thus, electrons tunnel through the gate dielectric layer of the state transistor 36 during programming, and electrons tunnel through the tunnel dielectric layer of the tunnel structure 34 during erasing. Referring to the memory array 10 in FIG. 1, electrons tunnel through the dielectric layer of the capacitor 14 during programming and erasing. As more charge carriers, such as electrons, pass through the same dielectric layer of the same component, more defects are generated within the dielectric. If the accumulated defects within the dielectric layer become too large, the dielectric layer breaks down and renders the memory cell inoperable. Thus, a memory cell within the NVM array 31 may have better reliability because charge carriers tunnel through different dielectric layers of different components during programming and erasing, as compared to a memory cell within memory array 10 where charge carriers tunnel through the same dielectric layer of the same component during programming and erasing.

Erase disturb can be reduced or even substantially eliminated with the NVM array 31. During an erase pulse, memory cells are erased as a row or as a segment of a row, such as a word. The selected erase line is at a particular voltage, such as $V_{PP}$, and all other lines are at substantially the same voltage, such as 0 volts, which is different from the particular voltage. Thus, other than the floating gate electrode, all electrodes of unselected cells are at about the same voltage, which significantly reduces the likelihood of an unselected memory cell being disturbed during an erase pulse. Referring to the memory array 10, memory cells are to be erased on a bit-by-bit basis. Thus, during an erase pulse, different voltages are used on the electrodes of unselected memory cells. The source regions of the state transistors 16 are at ground, the erase line 130 is at 10 volts, the erase line 131 is at $V_{DD}$, the control line 140 is at 0 volts, and the other control line 141 is at 0 volts. Thus, during an erase pulse, any of the unselected memory cells within the memory array 10 will have a voltage difference between at least two of (i) a source region of the state transistor 16, (ii) an electrode of the capacitor 12, and (iii) an electrode of the capacitor 14. The likelihood of erase disturb increases with the product of the voltage difference and time. If memory cell 100 in the memory array 10 is frequently programmed and erased, the other memory cells 101, 110, and 111 have a greater likelihood of an erase disturb problem, particularly if memory cells 101, 110, and 111 are programmed and erased infrequently. Thus, the likelihood of an erase disturb issue is significantly less with the NVM array 31 when using voltages in the table of FIG. 5 than with the memory array 10 in FIG. 1 when using voltages in the table of FIG. 2.

A variety of physical designs can be used with the NVM array 31. The layout of memory cell as illustrated is merely to simplify understanding of the different parts of the memory cell. Skilled artisans will appreciate that other layouts can be used to achieve a more compact memory cell. The description below provides some embodiments that can be used. For example, the NVM array 31 can be formed using a single poly type of process. Separate floating gate and control layers are not required. After reading this specification, skilled artisans will appreciate that many other embodiments can be used without deviating from the scope of the appended claims.

FIG. 6 includes an illustration of a cross-sectional view of a portion of a workpiece 40 that includes a substrate 42 having a primary surface 43. The substrate 42 can include a monocrystalline semiconductor wafer, a semiconductor-on-insulator wafer, a flat panel display (e.g., a silicon layer over a glass plate), or another substrate conventionally used to form electronic devices. The portion of the substrate 42 illustrated in FIG. 6 includes a Group 14 element (e.g., carbon, silicon, germanium, or any combination thereof) that is lightly doped with an n-type or p-type dopant. An insulating layer 46 is formed over the substrate 42, and field isolation regions 44 are formed within portions of the substrate 42. The insulating layer 46 can include a pad layer and a stopping layer (e.g., a polish-stop layer or an etch-stop layer) that are sequentially formed over the substrate 42 using a thermal growth technique, a deposition technique, or a combination thereof. Each of the pad layer and the stopping layer can include an oxide, a nitride, an oxynitride, or any combination thereof. In an embodiment, the pad layer has a different composition as compared to the stopping layer. In a particular embodiment, the pad layer includes an oxide, and the stopping layer includes a nitride. The field isolation regions 44 can be formed using a shallow trench isolation, local-oxidation-of-silicon, or another technique. The field isolation regions 44 define active regions 48, which are portions of the substrate 42 that lie between the field isolation regions 44.

FIG. 7 includes the workpiece of FIG. 6 after forming well regions 52, 54, 56, and 58. The insulating layer 46 is removed and an implant screen layer 50 is formed over the active regions. Well regions 52 and 56 have the same conductivity type, and well regions 54 and 58 have the opposite conductivity type as compared to well regions 52 and 56. In a particular embodiment, the well regions 52, 56, and 58 at least in part determine the dopant concentration of body regions of subsequently formed structures. The well region 54 can be a channel-stop region. A combination of the field isolation region 44 and well region 54 can help to electrically isolate the well regions 52 and 56 from each other. In a particular embodiment, the well regions 52 and 56 are n-well regions, and well regions 54 and 58 are p-well regions. The well regions 52, 54, 56, and 58 are lightly doped, and have dopant concentrations higher than the substrate 42. The well regions 52 and 56 may have the same dopant concentration or different dopant concentrations, and the well regions 54 and 58 may have the same dopant concentration or different dopant concentrations.

The well regions 52 and 56 can be formed during the same doping operation or different doping operations, and the well regions 54 and 58 may be formed during the same doping operation or different doping operation. In an embodiment, when a high-energy ion implanter is used, doped ions can be put at a sufficiently high energy so that dopant is implanted into the substrate 42 under the field isolation region 44 to form the well region 54. In this embodiment, well regions 54 and 58 can be formed during the same doping operation. In another embodiment (not illustrated), any or all of the well regions 52, 54, 56, and 58 may be formed before the field isolation region 44. In a particular embodiment, a high-energy ion implanter may not be available, and all of the well regions 52, 54, 56, and 58 may be formed before the field isolation region 44. In another particular embodiment, the well region 54 may be formed after patterning the insulating layer 46 to define an opening and doping the substrate 42 to form the well region 54 before forming the field isolation region 44. The other well regions 52, 56, and 58 may be formed after forming the field isolation regions.

In another embodiment (not illustrated), one or more of the well regions may be omitted. For example, if the dopant concentrations of the body regions for the subsequently-formed capacitor and tunnel structure (formed well regions 52 and 56) are greater than the dopant concentrations of the body regions for the subsequently-formed access and state transistors, the substrate 42 may have a conductivity type and dopant concentration, such that well region 58 may not be required.

After reading this specification, skilled artisans will appreciate that dopant concentrations and timing of formation of the well regions 52, 54, 56, and 58, both relative to one another and with respect to the field isolation region 44, can be adjusted to a particular application. Further, not all of the well regions 52, 54, 56, and 58 are required. Thus, the well regions 52, 54, 56, and 58, or the absence thereof, can be tailored for the particular components that will be formed within the well regions.

Figure 8:
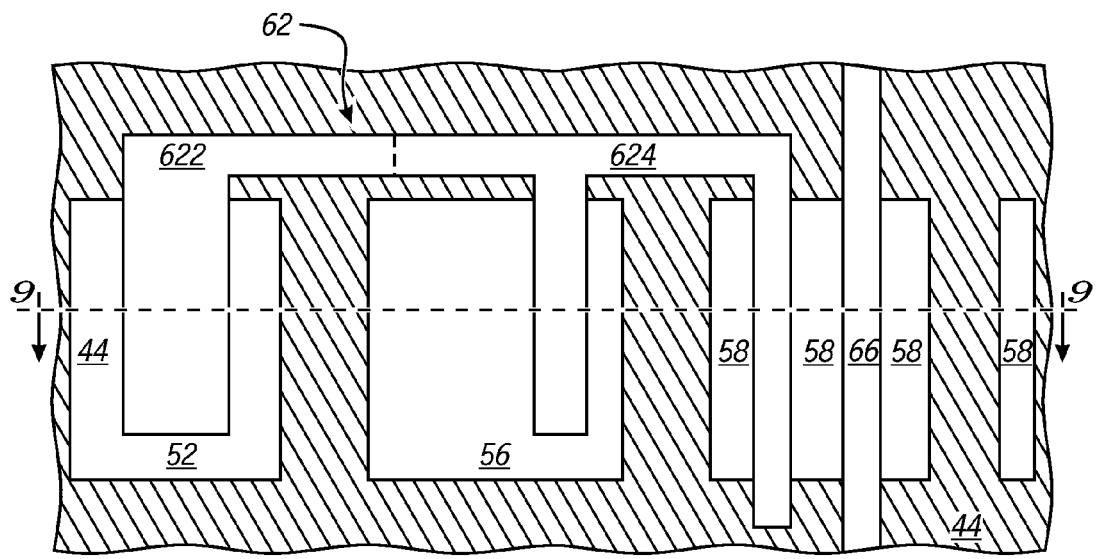
FIGS. 8 and 9 include illustrations of a top view and a cross-sectional view, respectively, of the workpiece of FIG. 7 after forming a dielectric layer and a patterned conductive layer.
Figure 9:
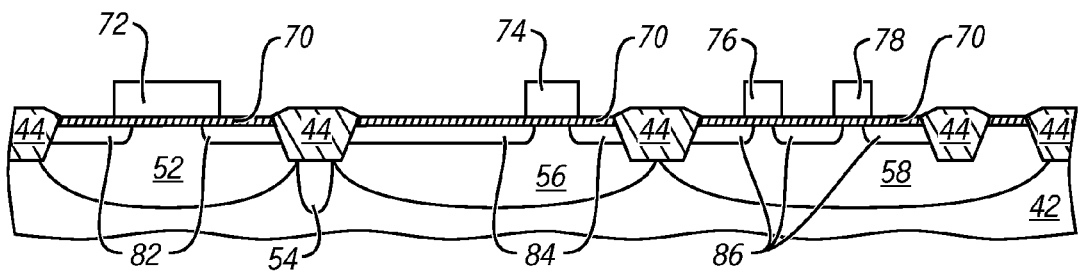

FIGS. 8 and 9 include illustrations of a top view and a cross-sectional view, respectively, after removing the implant screen layer 50 and forming a dielectric layer 70 and a patterned conductive layer 62. FIG. 9 includes a cross-sectional view at sectioning line 9-9 in FIG. 8. The implant screen layer 50 is removed, and the dielectric layer 70 is formed over the well regions 52, 56, and 58. The dielectric layer 70 can include portions that will be a capacitor dielectric layer over well region 52, a tunnel dielectric layer over the well region 56, and a gate dielectric layer over the well region 58. The dielectric layer 70 can include an oxide, a nitride, an oxynitride, or any combination thereof. In an embodiment, the thickness of the dielectric layer 70 is no greater than approximately 20 nm, and in another embodiment, the dielectric layer 70 is at least approximately 5 nm. In a particular embodiment, the dielectric layer 70 has a thickness in a range of approximately 11 to approximately 15 nm. The different portions of the dielectric layer can have the same composition or different composition, and the same thickness or different thicknesses. The dielectric layer 70 can be formed using a thermal growth technique, a deposition technique, or a combination thereof.

A layer of a polycrystalline or amorphous semiconductor material is formed by depositing the polycrystalline or amorphous semiconductor material over the substrate 42 and doped to include a p-type heavily doped portion and an n-type heavily doped portion to make the layer conductive. The polycrystalline or amorphous semiconductor material includes one or more Group 14 elements. In one embodiment, the layer has a thickness no greater than approximately 500 nm, and in another embodiment, the layer has a thickness of at least approximately 50 nm. In a particular embodiment, the layer has a thickness in a range of approximately 100 nm to approximately 300 nm. The layer is patterned to form a conductive member 62 and a word line 66, as illustrated in FIG. 8. The conductive member 62 is the floating gate for the memory cell. Portions 622 and 624 of the conductive member 62 have opposite conductivity types. In a particular embodiment, the portion 622 has a p-type conductivity, and the portion 624 and the word line 66 have an n-type conductivity. A subsequently-formed metal-containing layer will be formed over the portions 622 and 624, so that the portions are electrically connected to each other to form a floating gate electrode for the memory cell. Referring to FIG. 9, the part of the conductive member 62 that is disposed over the well region 52 is an upper electrode 72 for a capacitor, another part of the conductive member 62 that is disposed over the well region 56 is an upper electrode 74 for a tunnel structure, and still another part of the conductive member 62 that is disposed over the well region 58 is a gate electrode 76 for a state transistor. The portion of the word line 66 disposed over the well region 58 is a gate electrode 78 for an access transistor.

Figure 10:
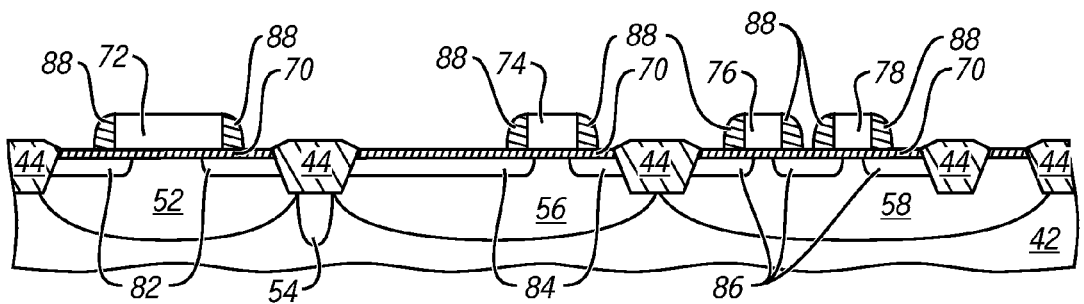
FIG. 10 includes an illustration of a cross-sectional view of the workpiece of FIGS. 8 and 9 after forming doped regions within the active regions not covered by the patterned conductive layer and after forming insulating spacers.

FIG. 10 includes an illustration of a cross-sectional view after forming intermediate doped regions 82, 84, and 86 and insulating spacers 88. Before forming the intermediate doped regions 82, 84, and 86, an oxide layer (not illustrated) may be formed by thermally oxidizing the conductive member 62 and word line 66, including upper electrodes 72 and 74 and gate electrodes 76 and 78. The oxide layer has a thickness no greater than approximately 20 nm. In an embodiment, the intermediate doped regions 82 and 84 have the same conductivity type, and the intermediate doped regions 86 have the opposite conductivity type. In a particular embodiment, intermediate doped regions 82 and 84 have a p-type conductivity, and the intermediate doped regions 86 have an n-type conductivity. In an embodiment, a patterned masking layer (not illustrated) is formed that includes a masking member (not illustrated) over the well region 58 and an opening over the well regions 52, 54, and 56, and the intermediate doped regions 82 and 84 are formed. The patterned masking layer is removed, a patterned masking layer (not illustrated) is formed that includes a masking member (not illustrated) over the well region 58 and an opening over the well regions 52, 54, and 56, and the intermediate doped regions 82 and 84 are formed. The patterned masking layer can be removed, and another masking layer (not illustrated) is formed that includes another masking member (not illustrated) over the well regions 52, 54, and 56, and an opening over the well region 58, and the intermediate doped regions 86 are formed. In a particular embodiment, the intermediate doped regions 82, 48, and 86 are formed by ion implantation. The intermediate doped regions 82, 84, and 86 can have dopant concentrations of less than $1 \times 10^{19}$ atoms/cm$^3$, and in an embodiment, the intermediate doped regions 82, 84, and 86 have dopant concentrations greater than well regions 52, 56, and 58, respectively. In a particular embodiment, the intermediate doped regions 82, 84, and 86 have dopant concentrations in a range of approximately $1 \times 10^{17}$ atoms/cm$^3$ to approximately $1 \times 10^{18}$ atoms/cm$^3$. In needed or desired, the order of forming the patterned masking layers and the intermediate doped regions 82, 84, and 86 can be reversed.

An insulating layer is conformally deposited and anisotropically etched to form the insulating spacers 88. The insulating spacers 88 include an oxide, a nitride, an oxynitride, or any combination thereof. The widths of the insulating spacers 88, as measured at their bases, generally correspond to the thickness of the insulating layer that is deposited. In an embodiment, the thickness of the insulating layer, as deposited, is no greater than approximately 500 nm, and in another embodiment, the thickness is at least approximately 20 nm. In a particular embodiment, the thickness is in a range of approximately 50 to 200 nm.

Figure 11:
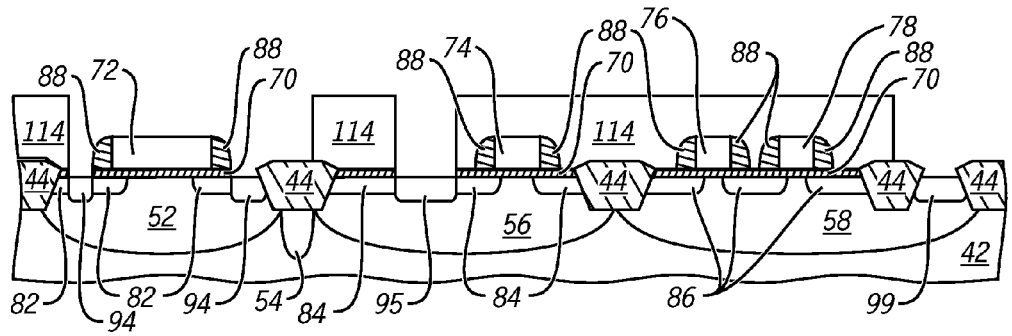
FIG. 11 includes an illustration of a cross-sectional view of the workpiece of FIG. 10 after forming heavily doped regions within portions of the active regions.
Figure 12:
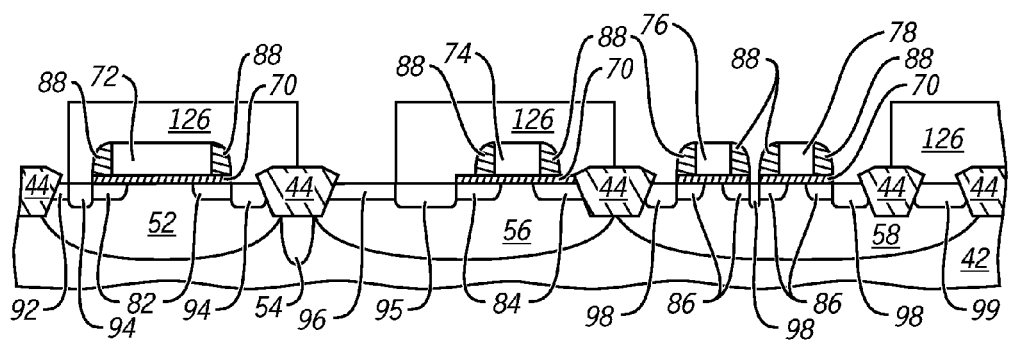
FIG. 12 includes an illustration of a cross-sectional view of the workpiece of FIG. 11 after forming a substantially completed nonvolatile memory cell.

Heavily doped regions 92, 94, 95, 96, 98, and 99 are formed within the well regions 52, 56, and 58, as illustrated and described with respect to FIGS. 11 and 12. In an embodiment, heavily doped regions 92, 96, and 98 have a conductivity type opposite that of heavily doped regions 94, 95, and 99. In a particular embodiment, heavily doped regions 92, 96 and 98 have an n-type conductivity, and heavily doped regions 94, 95, and 99 have a p-type conductivity. The heavily doped regions 92, 94, 96, 98, and 99 can have the same dopant concentration or different dopant concentrations. In a particular embodiment, the heavily doped regions 92, 94, 95, 96, 98, and 99 have a dopant concentration of at least approximately $1 \times 10^{20}$ atoms/cm$^3$. The depths of the heavily doped regions 92, 94, 95, 96, 98, and 99 are relatively shallow and may have depths no greater than approximately 500 nm. In a particular embodiment, the depths of the heavily doped regions 92, 94, 95, 96, 98, and 99 are in a range of approximately 50 to 300 nm. In the embodiment as illustrated, the heavily doped regions 92 and 95 have junction depths that are deeper than the intermediate doped regions 82 and 84, respectively.

A patterned masking layer is formed over the workpiece and includes masking member 114 as illustrated in FIG. 11. A masking member 114 closest to the left-hand side of FIG. 11 covers a portion of the well region 52 where a well contact region to the well region 52 will be formed, the masking member that covers portions of the well regions 54 and 56 where a well contact region to the well region 56 will be formed, and the other masking member covers a remainder of the tunnel structure and covers the state and access transistors. Heavily doped regions 94, 95, and 99 are formed through openings in the patterned masking layer. The heavily doped regions 94 and 95 allow electrical contact to be made to the intermediate doped regions 82 and 84, respectively. In FIG. 11, the right-hand edge of the heavily doped region 95 can be moved so that it is aligned to the sidewall spacer 88 beside the upper electrode 74 if needed or desired. By having the right-hand edge of the heavily doped region 95 offset from the sidewall spacer 88, as illustrated in FIG. 11, a higher voltage can be used for erasing without increasing the likelihood that dielectric layer 70 will break down during erasing. The heavily doped region 99 is a well contact region for the well region 58. If the well region 58 would not be present, the heavily doped region 99 would be a substrate contact region for substrate 42. The patterned masking layer that includes masking members 114 is removed.

Another patterned masking layer is formed over the workpiece and includes masking member 126 as illustrated in FIG. 12. A masking member 126 closest to the left-hand side of FIG. 12 covers most of the capacitor except a portion of the well region 52 where a well contact region to the well region 52 will be formed, the masking member 126 near the center of FIG. 12 covers most of the tunnel structure except a portion of the well region 56 where a well contact region to the well region 56 will be formed, and the other masking member 126 covers the well contact regions for the well region 58. Heavily toped regions 92, 96, and 98 are formed through openings in the patterned masking layer. The heavily doped regions 92 and 96 are well contact regions for the well regions 52 and 56, respectively. The heavily doped regions 98 are source, source/drain, and drain regions for the state and access transistors. The patterned masking layer that includes masking members 126 is removed. In needed or desired, the order of forming the patterned masking layers and the heavily doped regions 92, 94, 95, 96, 98, and 99 can be reversed.

Figure 13:
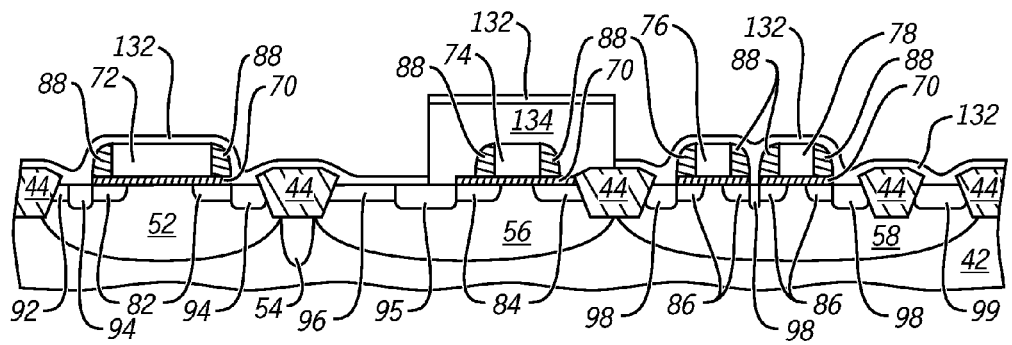
FIGS. 13 to 16 include illustrations of cross-sectional views of tunnel structures in accordance with other embodiments.

FIG. 13 includes an illustration after forming a silicide blocking mask 134 and depositing a metal layer 132. The silicide blocking mask 134 is a sacrificial layer that will be removed after forming silicide regions. In an embodiment, the silicide blocking layer 134 can include a dielectric material, such as a nitride, an oxide, or an oxynitride. When the field isolation regions 44 include oxide and the silicide blocking mask 134 includes an oxide or an oxynitride, the composition of the silicide blocking mask 134 can be different such that the silicide blocking mask 134 can be etched selectively to the field isolation regions 44. For example, the silicide blocking mask 134 can include an undensified deposited film, have a relatively high concentration of dopant, or a combination thereof. A short etch is performed to remove the dielectric layer 70 from portions of the well regions and gate electrodes that are not covered by the silicide blocking mask 134. The metal layer 132 is deposited over the exposed surface of the workpiece. The metal layer 132 can include a transition metal, and in a specific embodiment, can include a refractory metal. As used herein, refractory metals and refractory metal-containing compounds can withstand high temperatures (e.g., melting points of such materials can be at least 1400° C.) and have a lower bulk resistivity than heavily doped semiconductor materials. An exemplary metal for the metal layer 132 can include Ti, Ta, W, Pt, Co, Ir, or another suitable material that can react with the materials within the well regions and gate electrodes.

Figure 14:
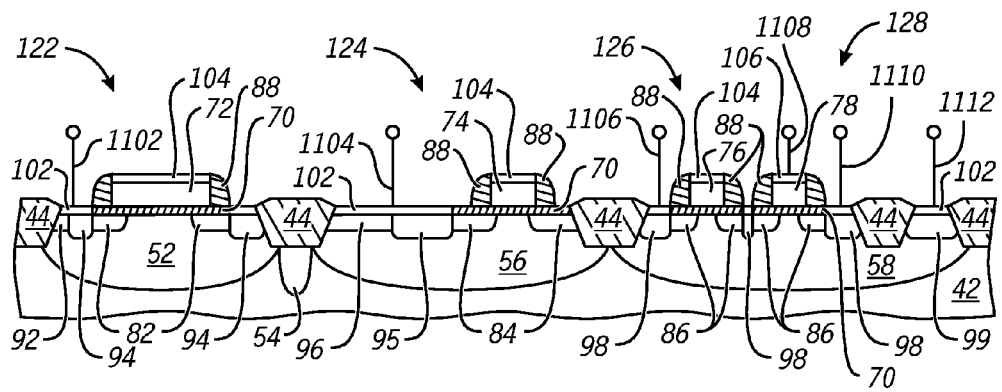

FIG. 14 includes an illustration of a cross-sectional view after forming a substantially completed memory cell. The workpiece including the metal layer 132 are heated to allow the conductive layer to react with portions of a semiconductor material to form a metal-semiconductor members 102, 104, and 106 that include a metal-semiconductor compound. The metal layer 132 does not significantly react with the silicide blocking mask 134 and insulating materials, such as the field isolation region 44 and the insulating spacers 88. Unreacted portions of the metal layer 132 are removed, and then the silicide blocking mask 134.

The metal-semiconductor members 102 include a semiconductor material within the active regions, and the metal-semiconductor members 104 and 106 include a semiconductor material within the conductive member 62 (see FIG. 6), which includes the upper electrode 72 and gate electrode 76, and within the word line 66, which includes the gate electrode 78. The silicide blocking mask 134 substantially prevents the metal-semiconductor member 104 from forming over the portion of the conductive member that overlies the well region 46, wherein such portion corresponds to the upper electrode of the tunnel structure. The metal-semiconductor member 104 electrically connects the differently doped portions 622 and 624 of the conductive member 62 to each other.

The memory cell includes a capacitor 122, a tunnel structure 124, a state transistor 126, and an access transistor 128. In the embodiment as illustrated, the capacitor 122 is a PMOS capacitor, and the state and access transistors 126 and 128 are n-channel transistors.

Further processing is performed so that the heavily doped regions 92 and 94 are coupled to a control gate terminal 1102, the heavily doped regions 95 and 96 are coupled to an erase terminal 1104, the heavily doped region 98 closest to the center of FIG. 14 is coupled to a source terminal 1106, gate electrode 78 is coupled to an access terminal 1108, the heavily doped region 98 closest to the right-hand side of FIG. 14 is coupled to a drain terminal 1110, and the heavily doped region 99 is coupled to a ground or $V_{SS}$ terminal 1112. In a particular embodiment (not illustrated), one or more inter-level dielectric and interconnect levels are formed to complete formation of the integrated circuit. In this embodiment, the heavily doped regions 92 and 94 are coupled to a control line, the heavily doped regions 95 and 96 are coupled to an erase line, the heavily doped region 98 closest to the center of FIG. 14 is coupled to a source line, gate electrode 78 is coupled to an access line, the heavily doped region 98 closest to the right-hand side of FIG. 14 is coupled to a bit line, and the heavily doped region 99 is coupled to ground or $V_{SS}$ for the integrated circuit. In a more particular embodiment, couplings can be replaced by electrical connections. For example, the heavily doped regions 92 and 94 are electrically connected to a control gate terminal 1102 the heavily doped region 95 and 96 are electrically connected to an erase terminal 1104, the heavily doped region 98 closest to the center of FIG. 14 is electrically connected to a source terminal 1106, gate electrode 78 is electrically connected to an access terminal 1108, the heavily doped region 98 closest to the right-hand side of FIG. 14 is electrically connected to a drain terminal 1110, and the heavily doped region 99 is electrically connected to a ground or $V_{SS}$ terminal 1112.

In an embodiment (not illustrated), one or more interlevel dielectric and interconnect levels are formed to complete formation of the integrated circuit. In this embodiment, the heavily doped regions 92 and 94 are coupled to a control line, the heavily doped regions 95 and 96 are coupled to an erase line, the heavily doped region 98 closest to the center of FIG. 14 is coupled to a source line, gate electrode 78 is coupled to an access line, the heavily doped region 98 closest to the right-hand side of FIG. 14 is coupled to a bit line, and the heavily doped region 99 is coupled to ground or $V_{SS}$ for the integrated circuit.

Although not illustrated, other electrical components are formed using the process flow as previously described. For example, electronic components within program, erase, and read units, and if present, within the logic block can be formed using the process flow described above. Because the NVM cells are formed using a single poly process, rather than a double poly process, the NVM cells can be formed without adding any additional operations used to form electronic components, and particularly transistor structures, outside of the NVM cell array.

The operations of the memory cell are discussed with respect to the memory cell 3100 in FIG. 4 and the physical design in FIG. 14. During a program pulse, SL 1370, source terminal 1106, AL 3150, access terminal 1108, BL 3160, and drain terminal 1110 are at approximately 0 volts or $V_{SS}$. CL 3140, control gate terminal 1102, EL 3130, and erase terminal 1104 are at approximately $V_{PP}$. In a particular embodiment, $V_{PP}$ is in a range of approximately 10 volts to approximately 18 volts. During the erase pulse, electrons within the well region 58 tunnel into the gate electrode 76 of the state transistor 126. Thus, charge carriers pass through the dielectric layer 70 (that is, the gate dielectric layer) of the state transistor 126. The charge carriers affect the voltage of the floating gate for the memory cell. When the charge carriers are electrons, the voltage of the floating gate is reduced during a program pulse.

During an erase pulse, CL 3140, control gate terminal 1102, SL 1370, source terminal 1106, AL 3150, access terminal 1108, BL 3160, and drain terminal 1110 are at approximately 0 volts or $V_{SS}$. EL 3130 and erase terminal 1104 are at approximately $V_{PP}$. During the erase pulse, electrons within the floating gate tunnel into the well region 56 of the tunnel structure 124. Thus, charge carriers pass the through the dielectric layer 70 of the tunnel structure 124. The charge carriers affect the voltage of the floating gate for the memory cell. When the charge carriers are electrons, the voltage of the floating gate is increased during an erase pulse.

Thus, with the memory cell in accordance with the embodiment as illustrated in FIG. 14, charge carriers pass through the dielectric layer 70 of the state transistor 126 during a program pulse, and charge carriers pass through the dielectric layer 70 of the tunnel structure 124 during an erase pulse. Compare the memory cell as illustrated in FIG. 1, wherein charge carriers pass through the dielectric layer of the capacitor 14 both during a program pulse and during an erase pulse. Accordingly, for the same number of program and erase cycles, more charge can be trapped within the dielectric of the capacitor 14 as compared to each of the dielectric layer 70 of the state transistor 126 and the dielectric layer 70 of the tunnel structure 124. Therefore, the memory cells in FIGS. 4 and 12 are more resistant to dielectric breakdown during normal operation of the memory cells, as compared to the memory cells of FIG. 1.

During a reading operation, SL 1370 and source terminal 1106 are at approximately 0 volts or $V_{SS}$. CL 3140, control gate terminal 1102, EL 3130, and erase terminal 1104 are at approximately $V_{Gread}$. In an embodiment, $V_{Gread}$ is approximately $V_{DD}$. AL 3150 and access terminal 1108 are at approximately $V_{Access}$, which is approximately $V_{DD}$. The voltage for $V_{DD}$ will vary depending on the technology used. $V_{DD}$ can be in a range of approximately 0.9 volts to approximately 5.0 volts. BL 3160 and drain terminal 1110 may be pre-charged to a predetermined voltage, such as $V_{DD}$, $\frac{1}{2}V_{DD}$, or another voltage other than the voltage on SL 1370 and the source terminal 1106, before the read operation begins. During the read operation, a sense amplifier and other circuitry within the read unit can be coupled to BL 3160 and can determine the state of the memory cell 3100. If the voltage on BL 3160 remains above a predetermined threshold, no significant current flows through the state transistor 126, and the memory cell is determined to be in a program state. If the voltage on BL 3160 is reduced below the predetermined threshold, significant current flows through the state and access transistors 126 and 128, and the memory cell is determined to be in an erased state.

The tunnel structure 124 has significant features. The intermediate doped region 84 may or may not abut the metal-semiconductor member 102 overlying the heavily doped region 96. Further, the intermediate doped region 84 is significantly more heavily doped as compared to the well region 56. In a particular embodiment, the intermediate doped region 84 has a p-type conductivity, and the well region 56 and heavily doped region 96 have an n-type conductivity. The intermediate doped region 84 can form a leaky junction with the metal-semiconductor member 102, the heavily doped region 96, or both. During an erase pulse and a program pulse, the voltage on the erase terminal 1104 can be sufficiently high enough to cause breakdown between the intermediate doped region 84 and either or both of the metal-semiconductor member 102 and heavily doped region 96. Thus, during an erase or program pulse, the voltage on the intermediate doped region 84 can approach the voltage on the erase terminal 1104. The intermediate doped region 84 can help to control the space charge region that forms within the well region 56 to be limited to the portion of the well region 56 that directly underlies the upper electrode 74. Thus, the tunnel structure 124 may not go into deep depletion during an erase pulse.

Figure 15:
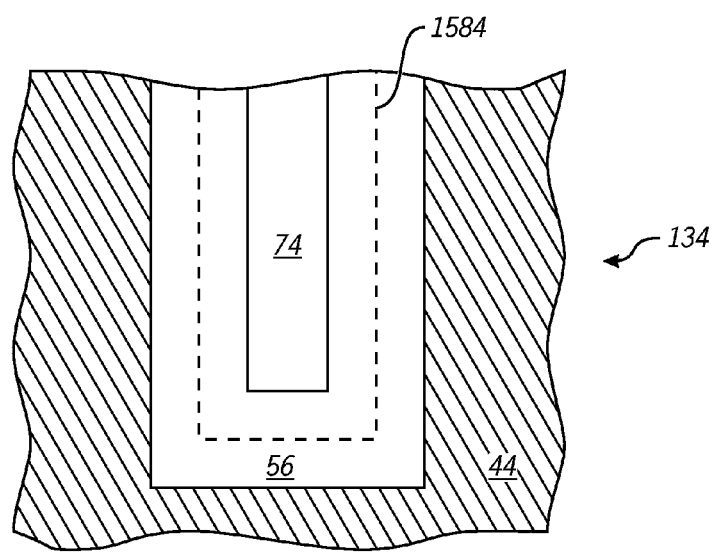

Another tunnel structure can be used for the tunnel structure 124. FIG. 15 includes a top view of a partially-formed tunnel structure 154. The field isolation region 44, well region 56, and the conductive member including the upper electrode 74 are formed using any of the embodiments as previously described. A mask is formed and has a shape as illustrated by dashed line 1584. The mask covers the field isolation region 44 and portions of the well region 56 immediately adjacent to the field isolation region 44. The mask defines an opening in which the upper electrode 74 and portions of the well region 56 immediately adjacent to the upper electrode 74 are exposed. A doping operation forms an intermediate doped region substantially similar to the intermediate doped region 84 except that the intermediate doped region using the mask would not extend to the field isolation region 44. For example, the first intermediate doped region can have an edge that is disposed between and spaced apart from the second electrode and an outer edge of the active region, wherein the outer edge is define by the field isolation region. The mask is removed, and although not illustrated, an insulating spacer 88 and a heavily doped region within the well region 56 are formed. The heavily doped region would be substantially similar to the heavily doped region 96. Unlike the heavily doped region 96, the heavily doped region formed using the embodiment as illustrated in FIG. 15 can have a junction depth that is shallower than the intermediate doped region and still make good contact with the well region 56.

The different tunnel structures as described herein can have different erase voltages. The description of voltages for erasing are presented solely to allow for a comparisons of erase voltages between different tunnel structures and not to limit any tunnel structure to a specific set of erasing voltages. For a memory cell being erased, the control terminal, source terminal, word line, and drain terminal are all at 0 volts. During an erase pulse, the tunnel structures 124 and 154 can be erased when the erase terminal is in a range of approximately 9.1 volts to approximately 9.6 volts. Although higher voltages than those described can be used, a lower voltage can allow a smaller charge pump within the erase unit to be used.

Other embodiments can be used without deviating from the scope of the present invention. The orientation of the memory array 31 can be changed by reversing rows and columns. In a particular embodiment, the illustration in FIG. 4 can be rotated 90°. The erase lines remain parallel to the control lines. In another embodiment, referring to FIG. 14, the portions of the heavily doped regions 94 and 96 do not need to be disposed at both sides of the active regions for the capacitor 122 and the tunnel structure 124. For example, the portions of the heavily doped regions 94 and 96 that are not disposed under a terminal (that is, the control gate terminal 1102 or the erase terminal 1104) are not required, as other portions of the heavily doped regions 94 and 96 underlie the control gate terminal 1102 or the erase terminal 1104 and provide a good ohmic contact to the corresponding well regions.

Further, the metal-semiconductor members 102, 104, and 106 can be formed at different times or may be replaced by another material. Referring to FIG. 8, after forming and doping the conductive layer for the conductive members 62 and 66, a metal-containing layer can be formed over the conductive layer before patterning to form conductive members 62 and 66. The metal-containing layer can include any of the materials as previously described with respect to the metal-semiconductor members 102, 104, and 106. Additionally, the metal-containing layer can include a metal-nitride or metal-semiconductor-nitride compound. The metal-nitride or metal-semiconductor-nitride compound many be conductive and act as an antireflective layer. Still further, a reaction may or may not be performed. The metal-containing layer can be in elemental form or may be deposited as a compound. With respect to the metal-semiconductor members 102, a contact silicidation process can be performed rather than forming the metal-semiconductor members 102 as illustrated.

A more robust NVM cell can be formed that is more resistant to dielectric breakdown from repeated program and erase cycles of a NVM cell. Further, the architecture of the NVM array 31 and its operation reduces the likelihood of an erase disturb of unselected memory cells when erasing selected memory cells. Thus, data integrity is better for the NVM array 31 as compared to the NVM array 10 of FIG. 1. Still further, the process flow for forming the NVM array 31 can be substantially the same as a process flow for forming transistors within logic block of the integrated circuit.

The memory cells as described herein allow the intermediate doped regions 84 to be biased using the erase terminal 1104, via the metal-semiconductor member 102 and the heavily doped region 95. Although not prior art under US patent law, each of US 2011/0316060, US 2011/0316067, and US 2011/0317492 discloses nonvolatile memory cells ("other memory cells"), wherein intermediate doped regions 84 can electrically float. The memory cells as disclosed herein can provide further benefits beyond the other memory cells. As will be described later in this specification, the memory cells as described herein can be programmed and erased at lower voltages and allow the memory cells to withstand more program-erase cycles as compared to the other memory cells and other convention memory cells formed using a single polysilicon logic process flow, such as disclosed in US 2006/0220096 ("conventional memory cells"). In an embodiment, at 100,000 program-erase cycles at 135° C., the failure rate of conventional memory cells or other memory cells can be at least approximately one, approximately two, or approximately three orders of magnitude higher than the memory cells as described herein. In another embodiment, at a failure rate of 10 ppm, the memory cells as described herein can withstand at least approximately two, approximately five, or approximately nine times the number of program-erase cycles at 135° C. as compared to the conventional memory cells or the other memory cells.

After reading this specification, skilled artisans will appreciate that many different layouts and processing operations can be used without deviating from the present invention. The layout as illustrated in FIG. 8 is provided to simplify understanding of an exemplary layout for a memory cell. Many other layouts can be used, and a more compact cell can be formed in another embodiment. The exact physical orientation of each component within the memory cell can be changed as long as the couplings and electrical connections described herein are maintained. The order of some processing operations can be changed if needed or desired.

The memory cell in the embodiment as illustrated and described in FIG. 14 is programmed and erased using Fowler-Nordheim tunneling. In another embodiment, the memory cell of FIG. 14 may be programmed using hot carrier injection. In this embodiment, the voltage on CL 3140, control gate terminal 1102, EL 3130, and erase terminal 1104 can be in a range of approximately 6 volts to approximately 8 volts, SL 3170 and source terminal 1106 are at approximately 0 volts or $V_{SS}$, and AL 3150, access terminal 1108, BL 3160, and drain terminal 1110 can be in a range of approximately 4 to approximately 6 volts. In this particular embodiment, electrons can be injected into the floating gate at the gate electrode 76 of the state transistor 126. All unselected lines and terminals would be at substantially 0 volts, and therefore, the NVM array 31 may be more resistant to program disturb issues as compared to the NVM array 10 in FIG. 1. If program performance for hot carrier injection is to be improved, a p-type halo region could be formed near the drain of the state transistor 126. The erase operation can remain the same, and thus, carriers pass through dielectric layers of different components during program and erase pulses.

In yet further embodiments, the program and erase states can be reversed, such that the program state corresponds to a relatively higher floating gate voltage, and the erase state corresponds to a relatively lower floating gate voltage. Such an embodiment can be achieved by reversing the polarities of the voltages in the erase and program portions of the table in FIG. 5. For example, Vpp can be approximately −10 volts to approximately −18 volts. In addition, conductivity types may be reversed.

After reading this specification, skilled artisans will appreciate the flexibility in implementing different layouts, processing flows, operating techniques (program, erase, read), or any combination thereof that allow the NVM memory cell array to be tailored to a particular application. Thus, the NVM memory cell array can be integrated into an existing logic process flow, using existing program, erase, and read units for NVM memories with no or only some changes.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device including a nonvolatile memory cell can include a capacitor having a first electrode and a second electrode, wherein a control gate terminal is coupled to the first electrode. The electronic device can further include a tunnel structure having a first electrode and a second electrode, wherein an erase terminal is coupled to the first electrode, at least a portion of the second electrode has a first conductivity type, and the tunnel structure includes an intermediate doped region adjacent to the first electrode, wherein the intermediate doped region has a second conductivity type opposite the first conductivity type, a first heavily doped region having the second conductivity type and a dopant concentration that is higher than the dopant concentration of the intermediate doped region, and a second heavily doped region having the first conductivity type and a dopant concentration that is higher than the dopant concentration of the intermediate doped region. From a top view, the first heavily doped region can be disposed between the intermediate doped region and the second heavily doped region. The electronic device can further include a state transistor including a source region, a drain region, and a gate electrode, wherein a floating gate electrode for the nonvolatile memory cell includes the gate electrode, the second electrode of the capacitor, and the second electrode of the tunnel structure. The electronic device can still further include an access transistor including a source region, a drain region, and a gate electrode, wherein the source region of the access transistor is coupled to the drain region of the state transistor.

In an embodiment of the first aspect, the first and second heavily doped regions are electrically connected to each other. In a particular embodiment, the tunnel structure further includes a metal-containing member that electrically connects the first and second heavily doped regions to each other. In another embodiment, the second electrode of the capacitor, the second electrode of the tunnel structure, the gate electrode of the state transistor, and the gate electrode of the access transistor are formed from a same layer including polycrystalline silicon or amorphous silicon. In still another embodiment, the electronic device further includes a metal-containing member disposed over and substantially coterminous with the floating gate electrode.

In a further embodiment of the first aspect, the capacitor includes a p-channel transistor structure, the state transistor is a first n-channel transistor, and the access transistor is a second n-channel transistor. In a particular embodiment, substantially all of the second electrode of the tunnel structure is n-type doped. In a more particular embodiment, the first electrode of the tunnel structure includes an n-well region, and a p-type region that is disposed within the n-well region and adjacent to the second electrode of the tunnel structure. In another more particular embodiment, the first electrode of the tunnel structure includes an n-well region that does not include a p-type region.

In still a further embodiment of the first aspect, the first electrode of the capacitor includes a first n-well region, the first electrode of the tunnel structure includes a second n-well region, the source and drain regions of the state and access transistors are disposed within a first p-type region, portions of the field isolation region are disposed between the first n-well region, the second n-well region, and the first p-type region, and the first n-well region, the second n-well region, and the first p-type region are electrically isolated from one another. In a particular embodiment, the electronic device further includes a second p-type doped region disposed below a particular portion of the field isolation region, wherein the substrate includes a semiconductor material and a dopant at a dopant concentration, the second p-type doped region has a dopant concentration that is greater than the dopant concentration of the semiconductor material, and the particular portion of the field isolation region abuts the first and second n-well regions. In a more particular embodiment, the electronic device further includes a p-type body contact region disposed within the first p-type region, wherein another particular portion of the field isolation region is disposed between the p-type body contact region and the state and access transistors.

In a second aspect, an electronic device can including a nonvolatile memory cell can include a capacitor having a first electrode and a second electrode, wherein a control gate terminal is coupled to the first electrode, and a tunnel structure having a first electrode, a second electrode, and a tunnel dielectric layer, wherein an erase terminal is coupled to the first electrode. The tunnel structure can include an intermediate doped region adjacent to the first electrode of the tunnel structure, wherein the intermediate doped region has a second conductivity type opposite the first conductivity type; a first heavily doped region having the second conductivity type and a dopant concentration that is higher than the dopant concentration of the intermediate doped region; and a second heavily doped region having the first conductivity type and a dopant concentration that is higher than the dopant concentration of the intermediate doped region. From a top view, the first heavily doped region is disposed between the intermediate doped region and the second heavily doped region. The electronic device can further include a state transistor including a source region coupled to a source terminal, a drain region, a gate dielectric layer, and a gate electrode, wherein a floating gate of the nonvolatile memory cell includes the gate electrode, the second electrode of the capacitor, and the second electrode of the tunnel structure. The electronic device can still further include an access transistor including a source region, a drain region coupled to a bit line terminal, and a gate electrode coupled to an access terminal, wherein the source region of the access transistor is coupled to the drain region of the state transistor. The electronic device can also include a program unit coupled to the control gate terminal, the erase terminal, the source terminal, the bit line terminal, and the access terminal, wherein the program unit is configured to program the nonvolatile memory cell by passing a first charge carrier through the gate electric layer of the state transistor; and an erase unit coupled to the control gate terminal, the erase terminal, the source terminal, the bit line terminal, and the access terminal, wherein the erase unit is configured to erase the nonvolatile memory cell by passing a second charge carrier through the tunnel dielectric layer of the tunnel structure.

In an embodiment of the second aspect, the tunnel structure further includes a metal-containing member that electrically connects the first and second heavily doped regions to each other. In another embodiment, the control gate terminal is electrically connected to the first electrode of the capacitor, the erase terminal is electrically connected to the first electrode of the tunnel structure, the source terminal is electrically connected to the source region of the state transistor, the bit line is electrically connected to the drain region of the access transistor, and the source region of the access transistor is connected to the drain region of the state transistor.

In a third aspect, a process of forming an electronic device including a nonvolatile memory cell can include forming a field isolation region within a substrate to define first, second, and third active regions, wherein the first, second, and third active regions are spaced apart from one another, and forming a floating gate electrode over the substrate and a part of the field isolation region, wherein the floating gate includes a first portion disposed over the first active region, a second portion disposed over the second active region, and a third portion disposed over the third active region. The method can further can include forming an access gate electrode over the third active region, wherein the access gate electrode and the floating gate electrode are spaced apart from each other, forming an intermediate doped region within the second active region and adjacent to the floating gate electrode, wherein the intermediate doped region has a first conductivity type, forming a first heavily doped region within the second active region, wherein the first heavily doped region has the first conductivity type and a dopant concentration that is higher than the dopant concentration of the first intermediate doped region, and forming a second heavily doped region within the second active region, wherein the second heavily doped region has a second conductivity type opposite the first conductivity type, and a dopant concentration that is higher than the dopant concentration of the first intermediate doped region. Forming the intermediate doped region and the first and second heavily doped regions can be performed such that, from a top view, the first heavily doped region is disposed between the intermediate doped region and the second heavily doped region;

In an embodiment of the third aspect, the process further includes forming a first n-well region that includes the first active region, forming a second n-well region that includes the second active region, and forming a first p-well region within the third active region. The first conductivity type is p-type, and the second conductivity type is n-type. In another embodiment, forming the floating gate electrode is performed such that the first portion of the floating gate electrode has the second conductivity type, and the first active region has the first conductivity type, at least part of the second portion of the floating gate electrode has the first conductivity type, and the second active region has the first conductivity type, and the third portion of the floating gate electrode has the second conductivity type, and the third active region has the first conductivity type. In still another embodiment, the process further includes forming a mask over the first, second, and third active regions, wherein the mask defines an opening disposed over a particular portion of the field isolation region, and implanting a p-type dopant into the substrate at a location below the particular portion of the field isolation region. In a further embodiment, the process further includes forming a metal-containing layer over field isolation region, the first, second, and third active regions, the floating gate electrode, and the access gate electrode, and reacting portions of the metal-containing layer and portions of the first, second, and third active regions, the floating gate electrode, and the access gate electrode to form metal-semiconductor members. A first metal-semiconductor member is substantially coterminous with the floating gate electrode, a second metal-semiconductor member is substantially coterminous with the access gate electrode, and a third metal-semiconductor member electrically connects the first and second heavily doped regions and is spaced apart from the first metal-semiconductor member. The process further includes removing an unreacted portion of the metal-containing layer.

Note that not all of the activities described above in the general description or the examples are required, that a portion of a specific activity may not be required, and that one or more further activities may be performed in addition to those described. Still further, the order in which activities are listed is not necessarily the order in which they are performed.

EXAMPLE

The concepts described herein will be further described in the Example, which do not limit the scope of the invention described in the claims. The Example demonstrates that memory cells as described herein have an acceptable threshold voltage ($V_{Th}$) window and can withstand more program-erase cycles compared to the other and conventional memory cells.

Figure 16:
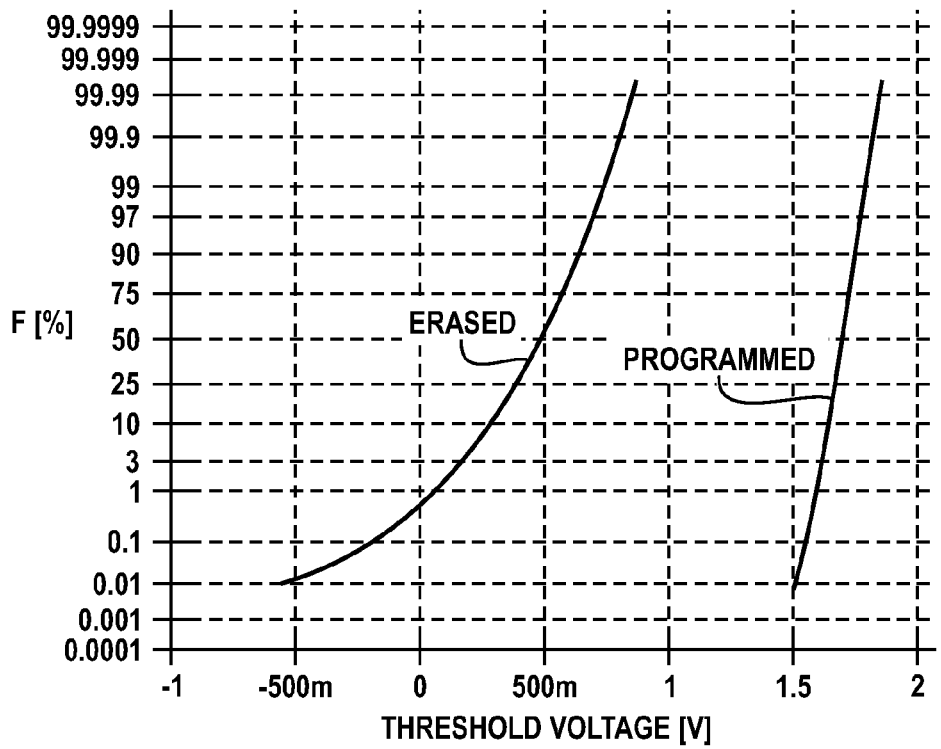

A memory array has a circuit as illustrated in FIG. 4 and a memory cell as illustrated in FIG. 14. VPP for programming is 8.8 V, and VPP for erasing is 9.4 V. FIG. 16 illustrates the threshold voltage distribution of the memory cells after programming (line closer to the right-hand side of FIG. 16) and after erasing (line closer to the left-hand side of FIG. 16). The voltage difference between the lowest threshold voltage of a programmed memory cell and the highest threshold voltage of an erased memory cell is the $V_{Th}$ window. For the memory cells, the $V_{Th}$ window is approximately 0.6 V. A $V_{Th}$ window of at least 0.5 V is sufficient to differentiate programmed from erased memory cells.

Figure 17:
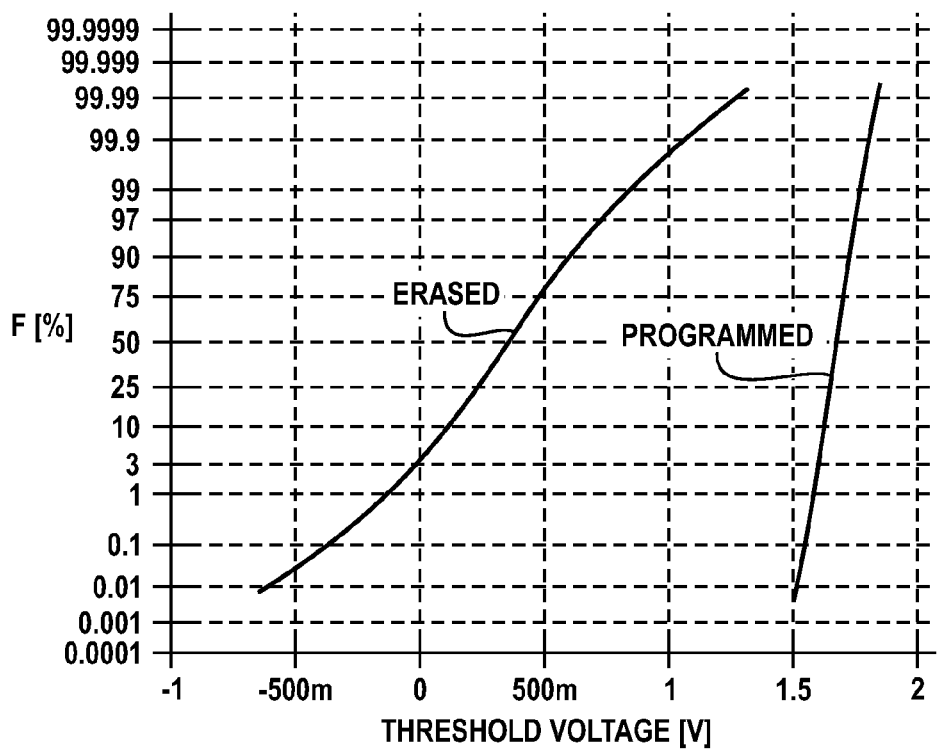
FIGS. 17 and 18 include illustrations of the threshold voltage distribution of the memory cells after programming and after erasing.
Figure 18:
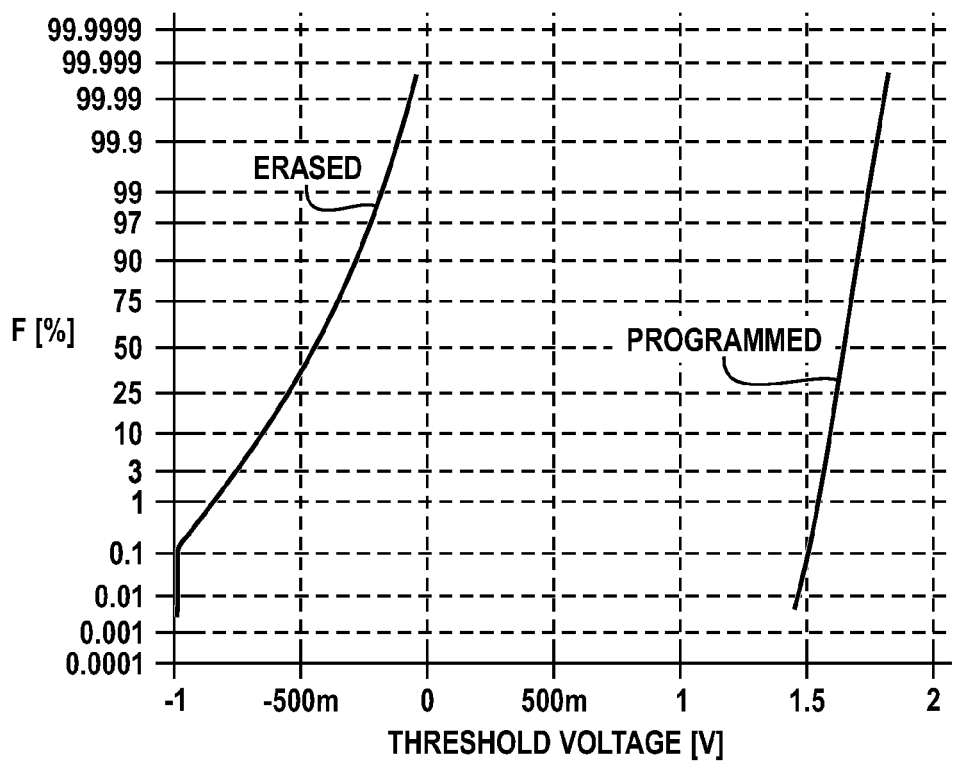

Referring to US 2011/0316060 discloses another memory array has a circuit as illustrated in FIG. 4 and a memory cell as illustrated in FIG. 12. VPP for programming is 8.8 V, and VPP for erasing is 9.4 V. FIG. 17 illustrates the threshold voltage distribution of the memory cells after programming (line closer to the right-hand side of FIG. 17) and after erasing (line closer to the left-hand side of FIG. 17). For the memory cells in US 2011/0136060, the $V_{Th}$ window is approximately 0.1 V, which is too small to differentiate programmed from erased memory cells. To improve the $V_{Th}$ window, VPP for programming is increased to 9.0 V, and VPP for erasing is increased to 9.6 V. FIG. 18 illustrates the threshold voltage distribution of the memory cells after programming (line closer to the right-hand side of FIG. 18) and after erasing (line closer to the left-hand side of FIG. 18) at the higher voltages. For the memory cells, the $V_{Th}$ window is approximately 1.3 V, which is sufficient to differentiate programmed from erased memory cells.

The memory cells in accordance with embodiments of the present invention can have improved endurance. In a particular embodiment, the deep depletion effect that can occur with particular conventional memory cells can be substantially eliminated. The deep depletion effectively shields the gate dielectric layer from VPP preventing erasing, and when the shielding effect goes away, the gate dielectric layer experiences a nearly instantaneous exposure to VPP causing degradation.

Figure 19:
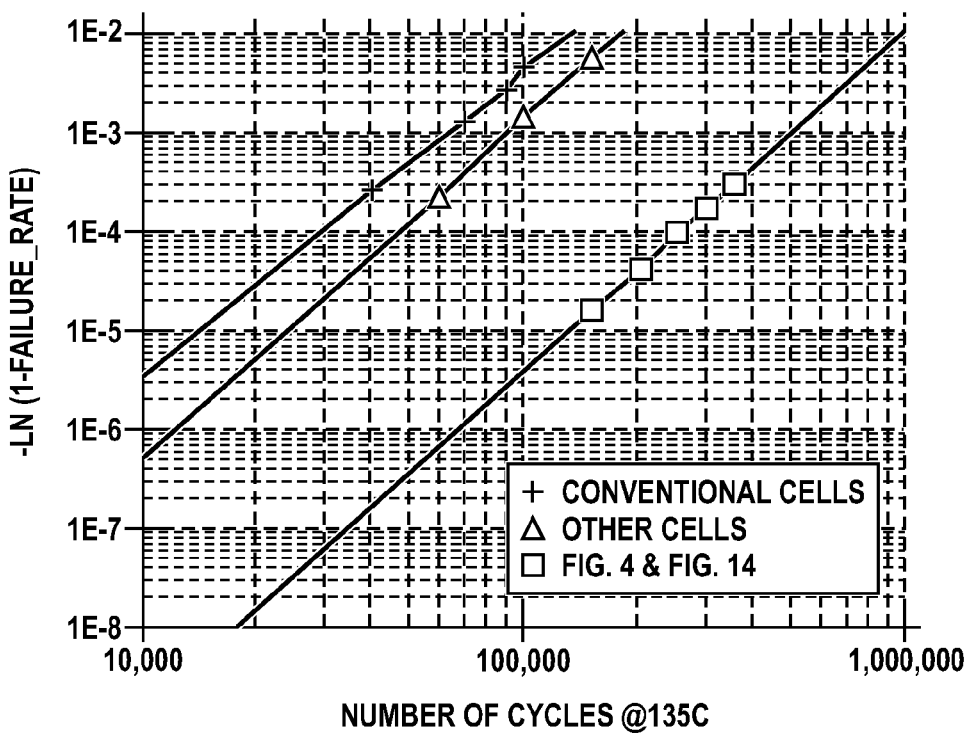
FIG. 19 includes a plot of failure rate as a function of program-erase cycles at 135° C.

FIG. 19 includes a plot of failure rate as a function of program-erase cycles at 135° C. The conventional cells in FIG. 19 correspond to memory cells in US 2006/0220096. At 100,000 program-erase cycles, the conventional cells have approximately 4200 failures per million memory cells, the other cells have approximately 1500 failures per million memory cells, and the memory cells of FIGS. 4 and 14 have approximately 3.7 failures per million memory cells. At a failure rate of 10 failures per million memory cells, the conventional memory cells can withstand approximately 15,000 program-erase cycles, the other memory cells can withstand approximately 25,000 program-erase cycles, and the memory cells of FIGS. 4 and 14 can withstand approximately 140,000 program-erase cycles. The other memory cells have a significant improvement over the conventional memory cells, and the memory cells of FIGS. 4 and 14 are have further improvement over both the conventional and other memory cells. Thus, the memory cells as described herein can withstand more program-erase cycles and have a lower failure rate from program-erase cycling.

Certain features that are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device including a nonvolatile memory cell comprising:
   forming a field isolation region within a substrate to define first, second, and third active regions, wherein the first, second, and third active regions are spaced apart from one another;
   forming a floating gate electrode over the substrate and a part of the field isolation region, wherein the floating gate includes:
      a first portion disposed over the first active region;
      a second portion disposed over the second active region; and
      a third portion disposed over the third active region;
   forming an access gate electrode over the third active region, wherein the access gate electrode and the floating gate electrode are spaced apart from each other;
   forming an intermediate doped region within the second active region and adjacent to the floating gate electrode, wherein the intermediate doped region has a first conductivity type;
   forming a first heavily doped region within the second active region, wherein the first heavily doped region has the first conductivity type and a dopant concentration that is higher than the dopant concentration of the first intermediate doped region; and
   forming a second heavily doped region within the second active region, wherein the second heavily doped region has a second conductivity type opposite the first conductivity type, and a dopant concentration that is higher than the dopant concentration of the first intermediate doped region,
   wherein forming the intermediate doped region and the first and second heavily doped regions are performed such that, from a top view, the first heavily doped region is disposed between the intermediate doped region and the second heavily doped region.

2. The process of claim 1, further comprising:
   forming a first n-well region that includes the first active region;
   forming a second n-well region that includes the second active region; and
   forming a first p-well region within the third active region, wherein the first conductivity type is p-type, and the second conductivity type is n-type.

3. The process of claim 1, wherein forming the floating gate electrode is performed such that:
   the first portion of the floating gate electrode has the second conductivity type, and the first active region has the first conductivity type;
   at least part of the second portion of the floating gate electrode has the first conductivity type, and the second active region has the first conductivity type; and
   the third portion of the floating gate electrode has the second conductivity type, and the third active region has the first conductivity type.

4. The process of claim 1, further comprising:
   forming a mask over the first, second, and third active regions, wherein the mask defines an opening disposed over a particular portion of the field isolation region; and
   implanting a p-type dopant into the substrate at a location below the particular portion of the field isolation region.

5. The process of claim 1, further comprising:
   forming a metal-containing layer over field isolation region, the first, second, and third active regions, the floating gate electrode, and the access gate electrode;
   reacting portions of the metal-containing layer and portions of the first, second, and third active regions, the floating gate electrode, and the access gate electrode to form metal-semiconductor members, wherein:
      a first metal-semiconductor member is substantially coterminous with the floating gate electrode;
      a second metal-semiconductor member is substantially coterminous with the access gate electrode; and
      a third metal-semiconductor member electrically connects the first and second heavily doped regions and is spaced apart from the first metal semiconductor member; and
   removing an unreacted portion of the metal-containing layer.

6. The process of claim 1, wherein the floating gate electrode is a single conductive member.

7. The process of claim 1, wherein the access gate electrode is part of a word line.

8. The process of claim 1, wherein:
   the first portion of the floating gate electrode has a p-type conductivity; and
   the second and third portions of the floating gate electrode have an n-type conductivity.

9. The process of claim 8, further comprising:
   forming n-well regions that include the first and second active regions;
   forming a p-well region that includes the third active region.

10. The process of claim 9, wherein:
    forming the field isolation region comprises forming the field isolation region within the substrate to define a fourth active region; and
    forming the p-well region comprises forming the p-well region that further includes the fourth active region.

11. The process of claim 10, further comprising forming a well contact region within the fourth active region.

12. The process of claim 11, wherein no gate electrode overlies the fourth active region.

13. A process of forming an electronic device including a nonvolatile memory cell comprising:
    forming a field isolation region within a substrate to define first, second, and third active regions, wherein the first, second, and third active regions are spaced apart from one another;
    forming a floating gate electrode over the substrate and a part of the field isolation region, wherein the floating gate includes:
       a first portion disposed over the first active region;
       a second portion disposed over the second active region; and
       a third portion disposed over the third active region;
    forming an access gate electrode over the third active region, wherein the access gate electrode and the floating gate electrode are spaced apart from each other;

forming an intermediate doped region within the second active region and adjacent to the floating gate electrode, wherein the intermediate doped region has a first conductivity type;

forming a first heavily doped region within the second active region, wherein the first heavily doped region has the first conductivity type and a dopant concentration that is higher than the dopant concentration of the first intermediate doped region; and forming a second heavily doped region within the second active region, wherein the second heavily doped region has a second conductivity type opposite the first conductivity type, and a dopant concentration that is higher than the dopant concentration of the first intermediate doped region, wherein forming the intermediate doped region and the first and second heavily doped regions are performed such that, from a top view, the first heavily doped region is disposed between the intermediate doped region and the second heavily doped region, and wherein:

the first portion of the floating gate electrode includes an electrode of a capacitor;

the second portion of the floating gate electrode includes an electrode of a tunnel structure;

the third portion of the floating gate electrode includes a gate electrode of a state transistor; and the capacitor, the tunnel structure, and the state transistor are spaced apart from one another.

14. The process of claim 13, wherein the state transistor and the access transistor include portions that are within a same well region.

15. The process of claim 13, further comprising:
forming a first n-well region that includes the first active region;
forming a second n-well region that includes the second active region; and
forming a first p-well region within the third active region, wherein the first conductivity type is p-type, and the second conductivity type is n-type.

16. The process of claim 13, wherein forming the floating gate electrode is performed such that:
the first portion of the floating gate electrode has the second conductivity type, and the first active region has the first conductivity type;
at least part of the second portion of the floating gate electrode has the first conductivity type, and the second active region has the first conductivity type; and
the third portion of the floating gate electrode has the second conductivity type, and the third active region has the first conductivity type.

17. The process of claim 13, wherein the floating gate electrode is a single conductive member.

18. The process of claim 13, further comprising:
forming a mask over the first, second, and third active regions, wherein the mask defines an opening disposed over a particular portion of the field isolation region; and
implanting a p-type dopant into the substrate at a location below the particular portion of the field isolation region.

19. The process of claim 13, wherein the access gate electrode is part of a word line.

20. The process of claim 13, further comprising:
forming a metal-containing layer over field isolation region, the first, second, and third active regions, the floating gate electrode, and the access gate electrode;
reacting portions of the metal-containing layer and portions of the first, second, and third active regions, the floating gate electrode, and the access gate electrode to form metal-semiconductor members, wherein:
a first metal-semiconductor member is substantially coterminous with the floating gate electrode;
a second metal-semiconductor member is substantially coterminous with the access gate electrode; and
a third metal-semiconductor member electrically connects the first and second heavily doped regions and is spaced apart from the first metal-semiconductor member; and
removing an unreacted portion of the metal-containing layer.

* * * * *